(12) United States Patent
Hashimoto et al.

(10) Patent No.: US 7,999,780 B2
(45) Date of Patent: Aug. 16, 2011

(54) DRIVE CIRCUIT CONTAINING AMPLIFIER CIRCUIT

(75) Inventors: Yoshiharu Hashimoto, Kanagawa (JP); Takayuki Shu, Kanagawa (JP); Masayuki Kumeta, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 842 days.

(21) Appl. No.: 11/696,626

(22) Filed: Apr. 4, 2007

(65) Prior Publication Data

US 2007/0241820 A1 Oct. 18, 2007

(30) Foreign Application Priority Data

Apr. 4, 2006 (JP) ................................ 2006-102750

(51) Int. Cl.
*G09G 3/36* (2006.01)
*H03F 1/36* (2006.01)

(52) U.S. Cl. ............ 345/98; 345/100; 330/86; 330/282; 330/291; 330/278

(58) Field of Classification Search .................. 345/204, 345/98, 100; 330/86, 260, 278, 282, 291
See application file for complete search history.

(56) References Cited

U.S. PATENT DOCUMENTS

| 6,014,122 A * | 1/2000 | Hashimoto | 345/98 |
| 7,663,588 B2 * | 2/2010 | Jang et al. | 345/89 |
| 2003/0107432 A1 * | 6/2003 | Huynh | 330/9 |
| 2008/0165179 A1 * | 7/2008 | Ayres | 345/214 |

FOREIGN PATENT DOCUMENTS

| JP | 7-264003 A | 10/1995 |
| JP | 10-260664 A | 9/1998 |
| JP | 11-184444 A | 7/1999 |
| JP | 2005-45718 A | 2/2005 |

* cited by examiner

*Primary Examiner* — Bipin Shalwala
*Assistant Examiner* — Ilana Spar
(74) *Attorney, Agent, or Firm* — Sughrue Mion, PLLC

(57) ABSTRACT

An amplifier circuit includes an operational amplifier having first and second input nodes and one output node which is connected to a data line for which a pixel is provided; a feedback circuit having first and second elements which are connected to one of the first and second input nodes at their one ends; and a first switch section. The first switch section switches an operation mode between a first drive mode in which the other end of the first element is connected to the output node and a second drive mode in which the other end of the second element is connected to the output node.

15 Claims, 14 Drawing Sheets

Fig. 4A

1ST AND 3RD FRAMES

|    | X1 | X2 | X3 | X4 | X5 | X6 |
|----|----|----|----|----|----|----|
| Y1 | +  | +  | +  | +  | +  | +  |
| Y2 | −  | −  | −  | −  | −  | −  |
| Y3 | +  | +  | +  | +  | +  | +  |
| Y4 | −  | −  | −  | −  | −  | −  |

Fig. 4B

2ND AND 4TH FRAMES

|    | X1 | X2 | X3 | X4 | X5 | X6 |
|----|----|----|----|----|----|----|
| Y1 | −  | −  | −  | −  | −  | −  |
| Y2 | +  | +  | +  | +  | +  | +  |
| Y3 | −  | −  | −  | −  | −  | −  |
| Y4 | +  | +  | +  | +  | +  | +  |

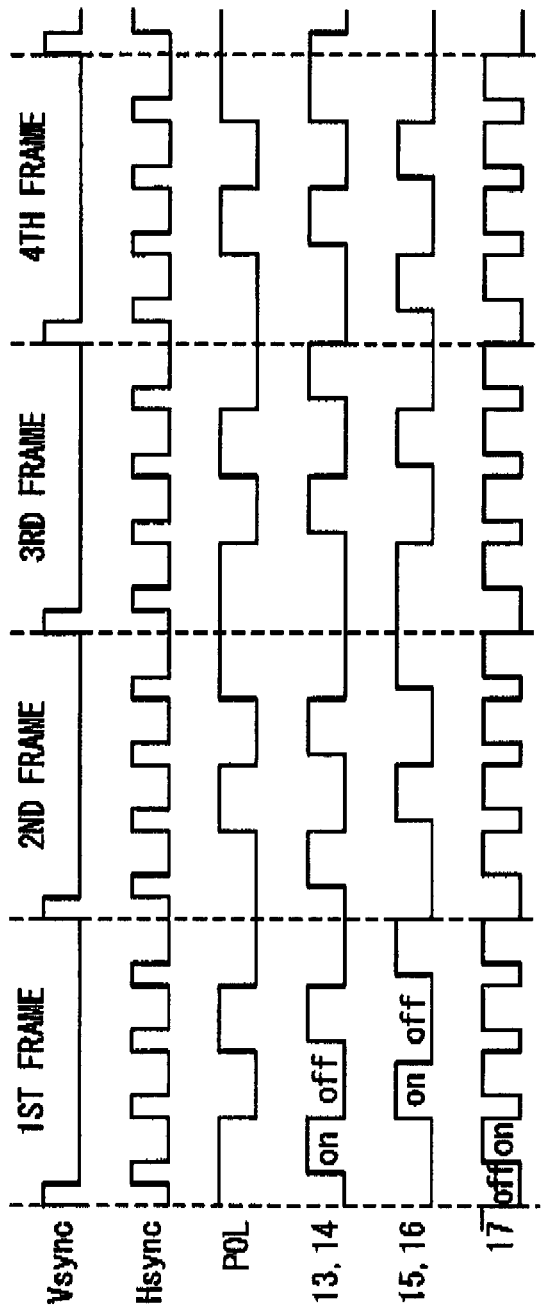

1ST AND 3RD FRAMES

| | X1 | X2 | X3 | X4 | X5 | X6 |
|---|---|---|---|---|---|---|
| Y1 | + | − | + | − | + | − |
| Y2 | − | + | − | + | − | + |
| Y3 | + | − | + | − | + | − |
| Y4 | − | + | − | + | − | + |

2ND AND 4TH FRAMES

| | X1 | X2 | X3 | X4 | X5 | X6 |
|---|---|---|---|---|---|---|
| Y1 | − | + | − | + | − | + |
| Y2 | + | − | + | − | + | − |
| Y3 | − | + | − | + | − | + |
| Y4 | + | − | + | − | + | − |

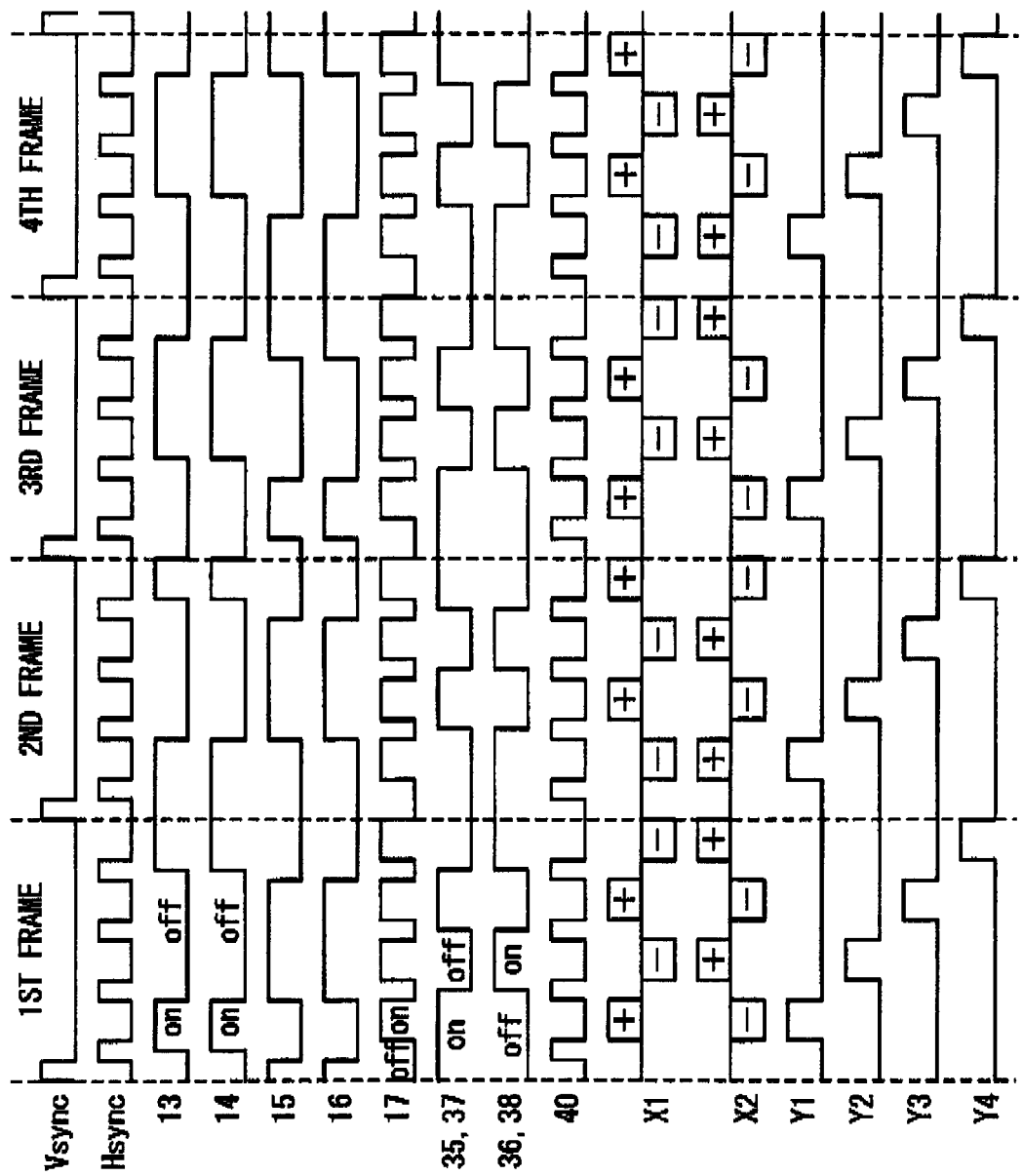

14, 15, 19: on 15, 16, 18: on 13, 14, 18: on

DRIVE CIRCUIT CONTAINING AMPLIFIER CIRCUIT

BACKGROUND OF THE INVENTION

1. Field of the Invention

The present invention relates to an amplifier circuit, and particularly to an amplifier circuit built in a drive circuit for driving a display panel.

2. Description of the Related Art

A display apparatus such as a liquid crystal display apparatus holds input digital display data in a latch circuit, converts the digital display data into an analog display signal by a D/A converter, and then amplifies the analog display signal by an amplifier circuit to drive data lines on a display panel. Generally, a drive voltage for driving the data line is higher than an operation voltage of a logic section such as the latch circuit. For this reason, the breakdown voltages of elements of the D/A converting section need to be higher than the breakdown voltages of elements of the logic circuit section.

A method of increasing the breakdown voltage of an MOS transistor is known in which the length L of a gate is made longer and the thickness Tox of a gate oxide film is made thicker. However, the driving capability of the transistor is reduced in this method. In this case, it is sufficient to increase the width W of the gate to prevent the reduction of the driving capability. However, a circuit area becomes larger exponentially. That is, when the breakdown voltage of the element of the D/A converting section is increased, the circuit area becomes larger.

Here, when a gain of the amplifier circuit is increased, the operation voltage of the D/A converting section can be lowered, thereby making the breakdown voltage of the element lower. Hereinafter, conventional techniques for increasing the gain of the amplifier circuit will be described.

Japanese Laid Open Patent Application (JP-A-Heisei 10-260664: first conventional example) discloses a liquid crystal drive circuit which is connected to a capacitance and includes an amplifier with a gain or amplification factor larger than "1". Also, Japanese Laid Open Patent Application (JP-A-Heisei 11-184444: second conventional example) discloses a liquid crystal drive circuit which is connected to a resistance and includes an amplifier with a gain or amplification factor larger than "1".

FIG. 1 is a circuit diagram showing a configuration of an amplifier circuit 1000 in the second conventional example. Referring to FIG. 1, the amplifier circuit 1000 includes an amplifier 80 whose non-inversion input node supplied with a gradation potential Vin and whose inversion input node connected with a connection node between one end of a resistance 81 and one end of a resistance 82. The other end of the resistance 81 is connected to an output node of the amplifier 80. The other end of the resistance 82 is connected to a reference voltage line. Here, it is supposed that the resistance value of the resistance 81 is Rb, the resistance value of the resistance 82 is Ra, the reference potential of the reference voltage line 83 is Vref and the voltage value of an output signal outputted from the amplifier 80 is Vout, an input-output characteristic of the amplifier 80 is expressed by the following equation (1).

$$V_{out}=(1+R_b/R_a)V_{in}-(R_b/R_a)V_{ref} \quad (1)$$

Here, in case of Vref=0 V, the characteristic is expressed by the following equation (2).

$$V_{out}=(1+R_b/R_a)V_{in} \quad (2)$$

As described above, gain=(1+Rb/Ra) is determined based on the resistance values of the resistance 81 and resistance 82. For example, in case of the amplifier 80 (ideal gain is 2), in which the resistance 81 and the resistance 82 have a same resistance value as a design value, it is sufficient to output the output signal Vout=0 to 5 V that the gradation voltage in the range of Vin=0 to 2.5 V needs to be supplied to the amplifier 80. Thus, the operation voltage of the D/A converting section supplying the gradation voltage Vin to the non-inversion input node of the amplifier 80 may be a half of a liquid crystal drive voltage. Consequently, since the breakdown voltage of the element can be lowered, the D/A converting section can be reduced in size.

On the other hand, techniques of controlling gain of an amplifier by changing a feedback resistance are described in Japanese Laid Open Patent Applications (JP-P2005-045718A and JP-A-Heisei 7-264003: third and fourth conventional examples).

According to the first and second conventional examples, when the resistance and the capacitance are provided in the amplifier circuit, the gain of the amplifier circuit is determined depending on parameters of these elements. Generally, the number of amplifier circuits for driving data lines on the display panel is a same as the number of data lines. For this reason, the resistances or the capacitances, which are provided in the respective amplifier circuits, vary due to manufacturing variation. That is, when the amplifier circuits described in the first and second conventional examples are used, the gains of the amplifier circuits would be different due to manufacturing variation of the elements built in the amplifier circuits. In detail, referring to FIG. 1, the ratio (Rb/Ra) of the resistance 81 and the resistance 82 varies depending on the amplifier circuit 1000. Since the amplifier circuits respectively drive the data lines based on different display signals, display unevenness would be caused on the display apparatus.

For example, it is supposed that a relative variation of the resistance 81 and the resistance 82 is 1% and Rb=0.99 Ra. In this case, Vout is 1.99 Vin. In the liquid crystal display apparatus, the sensitivity of display unevenness is high at halftone (around Vout=2.5 V). When Vin is 1.25 V, Vout becomes 2.4875 V. As a result, the voltage variation of 12.5 mV arises from the ideal value of 2.5 V. Generally, in the liquid crystal display apparatus, the variation of 5 mV or more in the display signal Vout in the halftone causes the display unevenness. Thus, when the relative variation between the resistance 81 and the resistance 82 is 1%, the display unevenness occurs. That is, when the amplifier circuit 1000 shown in FIG. 1 is used, manufacturing variation needs to be restricted within 0.4% to prevent the display unevenness. It is impractical to restrict resistance variation within 0.4% unless trimming is performed. However, since the driver IC for driving the liquid crystal panel has 384 or more amplification circuits, trimming is difficult.

SUMMARY OF THE INVENTION

In an aspect of the present invention, an amplifier circuit includes an operational amplifier having first and second input nodes and one output node which is connected to a data line for which a pixel is provided; a feedback circuit having first and second elements which are connected to one of the first and second input nodes at their one ends; and a first switch section. The first switch section switches an operation mode between a first drive mode in which the other end of the first element is connected to the output node and a second drive mode in which the other end of the second element is connected to the output node.

Here, the first switch section may switch the operation mode between the first drive mode and the second drive mode periodically.

Also, the amplifier circuit may further include a first wiring of a first voltage. The operational amplifier may have the first input node and the second input node to which a second voltage is applied. The first switch section may connect the other end of the second element to the first wiring in the first drive mode, and connect the other end of the first element to the first wiring in the second drive mode. The amplifier circuit may drive the data line based on the first voltage and the second voltage.

Also, the first element may have a same resistance as that of the second element. Alternately, the first element may have a same capacitance as that of the second element. In this case, the amplifier circuit may further include a second switch section provided between the one ends of the first and second elements and the first wiring to connect the one ends of the first and second elements and the first wiring at a same time as the switching between the first drive mode and the second drive mode.

Also, the first voltage may be a reference voltage, and the second voltage may be a gradation voltage.

Also, the second voltage may be a reference voltage, and the first voltage may be a gradation voltage.

Also, the amplifier circuit may further include a third switch section connected to first and second voltage sources. The third switch section may selectively connect one of the first and second voltage sources to the first wiring.

In another aspect of the present invention, an amplifier section includes a plurality of amplifier circuits which comprises: an operational amplifier having first and second input nodes and one output node which is connected to a data line for which a pixel is provided; a feedback circuit having first and second elements which are connected to one of the first and second input nodes at their one ends; and a first switch section. The first switch section switches an operation mode between a first drive mode in which the other end of the first element is connected to the output node and a second drive mode in which the other end of the second element is connected to the output node. The amplifier section further includes a connection selection switch section. The output node is connected to a plurality of the data lines through the connection selection switch section, and the connection selection switch section connects one of the plurality of data lines to the output node.

In still another aspect of the present invention, a drive circuit includes an amplifier circuit; a data latch section configured to latch a display data; and a D/A converting section configured to supply a gradation voltage to the amplifier circuit based on the display data. The amplifier circuit drives a display panel based on the gradation voltage. The amplifier circuit includes an operational amplifier having first and second input nodes and one output node which is connected to a data line for which a pixel is provided; a feedback circuit having first and second elements which are connected to one of the first and second input nodes at their one ends; and a first switch section. The first switch section switches an operation mode between a first drive mode in which the other end of the first element is connected to the output node and a second drive mode in which the other end of the second element is connected to the output node.

Here, the first switch section may switch the operation mode between the first drive mode and the second drive mode periodically.

Also, the amplifier circuit may further include a first wiring of a first voltage. The operational amplifier may have the first input node and the second input node to which a second voltage is applied. The first switch section may connect the other end of the second element to the first wiring in the first drive mode, and connect the other end of the first element to the first wiring in the second drive mode. The amplifier circuit may drive the data line based on the first voltage and the second voltage.

Also, the first element may have a same resistance as that of the second element. Alternately, the first element may have a same capacitance as that of the second element. In this case, the amplifier circuit may further include a second switch section provided between the one ends of the first and second elements and the first wiring to connect the one ends of the first and second elements and the first wiring at a same time as the switching between the first drive mode and the second drive mode.

Also, the first voltage may be a reference voltage, and the second voltage may be a gradation voltage.

Also, the second voltage may be a reference voltage, and the first voltage may be a gradation voltage.

Also, the amplifier circuit may further include a third switch section connected to first and second voltage sources. The third switch section may selectively connect one of the first and second voltage sources to the first wiring.

According to the present invention, a display apparatus having excellent display quality can be provided. Also, a circuit area of a drive circuit for driving the display apparatus can be reduced. In addition, power consumption of the drive circuit for driving the display apparatus can be suppressed.

BRIEF DESCRIPTION OF THE DRAWINGS

FIGS. 4A and 4B are diagrams showing polarity of voltage applied to pixels on a display panel in a line reverse driving method;

FIGS. 5A to 5F are timing charts showing a driving operation of a data line by the amplifying section according to first embodiment according to the present invention;

FIGS. 9A to 9P are timing charts showing an driving operation of a data line by the amplifying section according to the third embodiment of the present invention;

DESCRIPTION OF THE PREFERRED EMBODIMENTS

Figure 1:
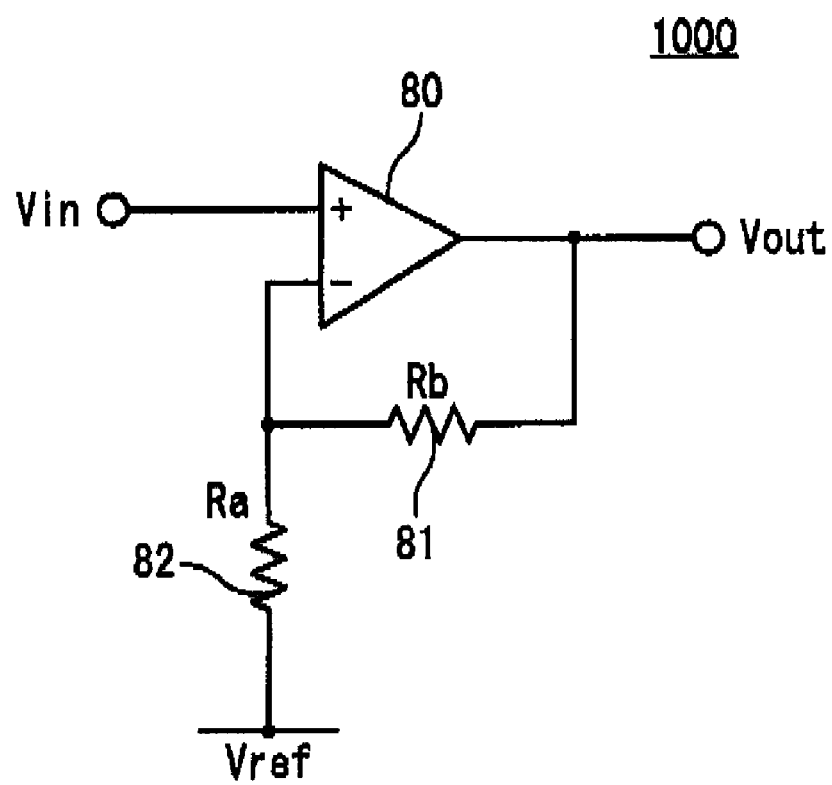
FIG. 1 is a circuit diagram showing the configuration of a conventional amplifying section.

Hereinafter, a drive circuit containing an amplifier circuit according to the present invention will be described with reference to the attached drawings. Here, in the following description, same or similar reference numerals denote the same, similar or equivalent components. When there are a plurality of similar components, a sequential number is added to the reference numeral. On the other hand, when the components are described collectively without being distinguished, a sequential number is not added to the reference numeral.

1. Configuration of Driver IC

Figure 2:
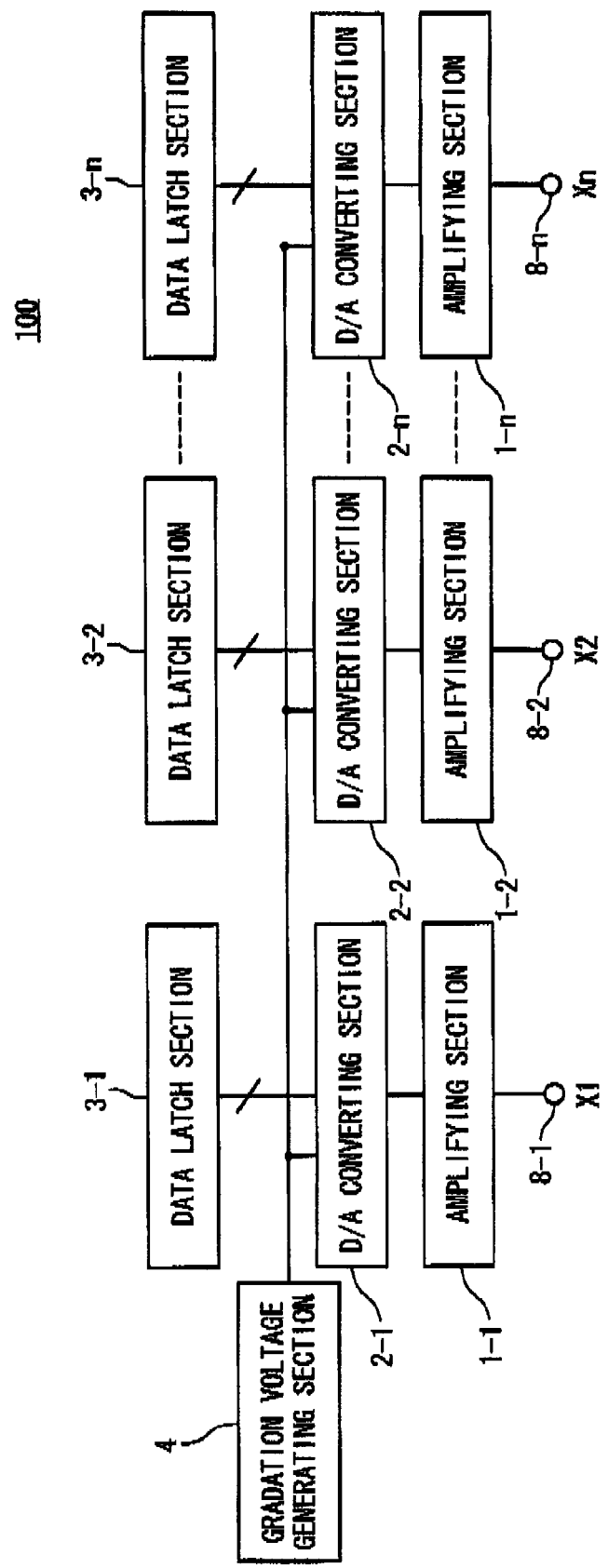
FIG. 2 is a block diagram showing a driver IC according to the present invention.

FIG. 2 is a block diagram showing the configuration of a driver IC 100 according to the present invention. Here, the driver IC 100 (data line drive circuit) drives a display panel of a liquid crystal display apparatus as an example. Referring to FIG. 2, the driver IC 100 according to the present invention is configured from a logic section for processing display data and an analog section including several hundreds of amplifying sections 1. When the display data supplied to the driver IC 100 is a digital signal, the driver IC 100 includes the amplifying sections 1 (1-1, 1-2, . . . , 1-$n$), D/A converting sections 2 (2-1, 2-2, . . . , 2-$n$), data latch sections 3 (3-1, 3-2, . . . , 3-$n$), and a gradation voltage generating section 4 at least. The driver IC 100 is connected to data lines X1 to Xn. The display panel has pixels (n×m) which are provided at intersection points of scan lines Y1 to Ym and the data lines X1 to Xn, which will be described later. The amplifying sections 1-1 to 1-$n$ output the display signals Vout to the data lines X1 to Xn through driver output terminals 8-1 to 8-$n$ to drive the data lines X1 to Xn and the pixels.

The gradation voltage generating section 4 generates a plurality of gradation voltages suitable for a gamma characteristic from a plurality of reference voltages. The gradation voltage generating section 4 includes a resistor string in which a plurality of resistances is connected to one after another. Here, the gradation voltage is a voltage difference between the gradation voltage vin suited to the gamma characteristic and a reference voltage Vref to be described later (for example, ground voltage GND).

The D/A converting sections 2 select a desired one from the plurality of gradation voltages generated by the gradation voltage generating section 4 based on the display data. The selected gradation voltage is not always limited to one and may be two or more. The selected gradation voltages (gradation voltage Vin–reference voltage Vref) are supplied to the amplifying sections 1.

The data latch sections 3 include a flip-flop circuit for latching the display data for a predetermined period. The logic section is provided with a control section (not shown) for generating a control signal to control the analog section including the amplifying sections 1, in addition to the data latch 3. Moreover, a frame memory and a shift register may be provided. Furthermore, a level shift section (not shown) is provided between the logic section and the analog section.

The analog section in the present embodiment has the amplifying sections 1, D/A converting sections 2 and the gradation voltage generating section 4.

Here, the display data signal supplied to the driver IC 100 is an analog signal, and the data latch section 3 may be configured from a sample hold circuit of a switch and capacitors. In this case, the D/A converting sections 2 and the gradation voltage generating section 4 are unnecessary.

The amplifying section 1 receives and amplifies the gradation voltage (voltage difference between the gradation voltage Vin and the reference voltage Vref), and outputs the display signal Vout to the data lines X. Hereinafter, the amplifying section 1 according to the present invention will be described in detail.

First Embodiment

Figure 3:
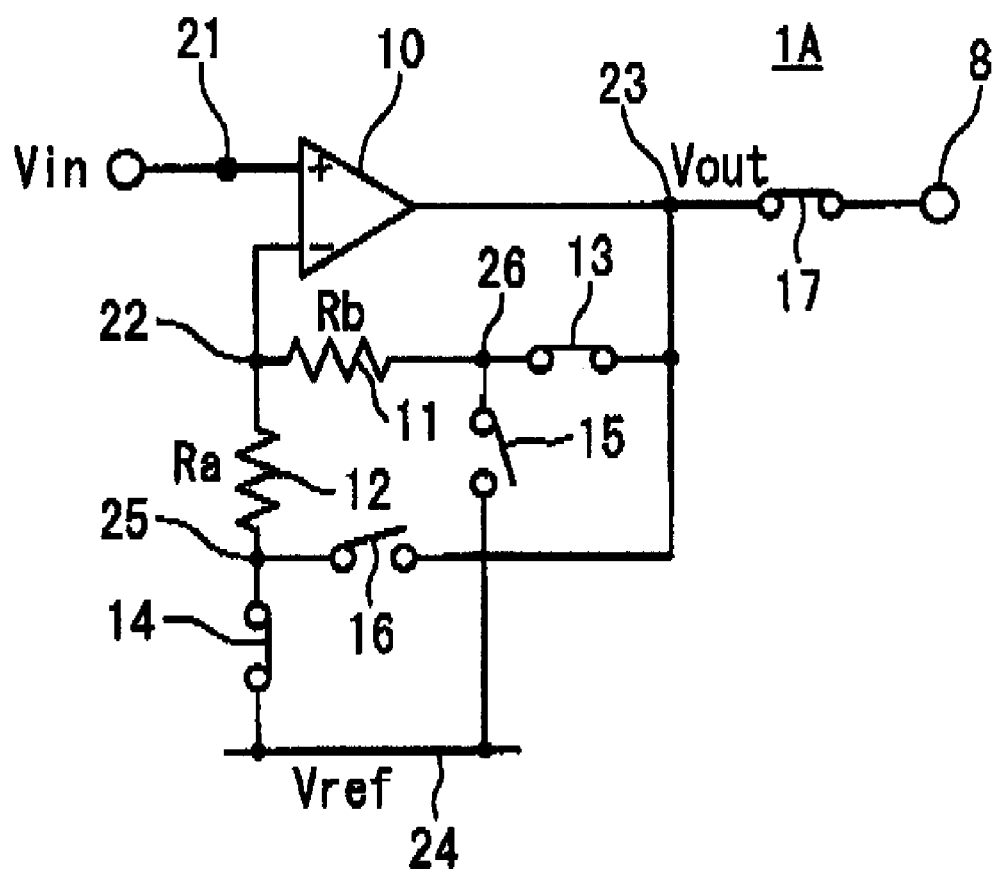
FIG. 3 is a circuit diagram showing the configuration of an amplifying section according to a first embodiment of the present invention.

Referring to FIG. 3, FIGS. 4A and 4B and FIGS. 5A to 5F, the amplifying section 1 according to the first embodiment of the present invention will be described. The driver IC 100 in the first embodiment has an amplifying section 1A, FIG. 3 is a circuit diagram showing the configuration of the amplifying section 1A in the first embodiment. Referring to FIG. 3, the amplifying section 1A has a differential amplifier 10, a resistance 11, a resistance 12 and switches 13 to 17 (hereinafter, to be referred to as cancel switches). The differential amplifier 10 has a non-inversion input node 21 to which the gradation voltage Vin is supplied, an inversion input node 22 and an output node 23 connected to the data line in a liquid crystal panel. One end of the resistance 11 and one end of the resistance 12 are connected to the inversion input node 22. A node 26 as the other end of the resistance 11 is connected to one end of the switch 13, and the other end of the switch 13 is connected to the output node 23. A node 25 as the other end of the resistance 12 is connected to one end of the switch 14, and the other end of the switch 14 is connected to a reference voltage line 24. The switch 15 is provided between the node 26 and the reference voltage line 24. The switch 16 is provided between the node 25 and the output node 23. The switch 17 is provided between the output node 23 of the amplifying section 1A and the driver output terminal 8 (or the data line X). The switch 17 is turned on when the display signal Vout is outputted from the output node 23 to the data line X through the driver output terminal 8. Also, the switch 17 is turned off when the display data is latched or the switches 13 to 16 are switched. At this time, a connection between the amplifying section 1A and the data line X is temporarily put into a high impedance state, thereby preventing occurrence of inappropriate voltage (glitch) supplied from the output node 23 to the data line X. The gradation voltage Vin is supplied to the non-inversion input node 21 and the display signal Vout for driving pixels on the data line is outputted from the output node 23.

It is preferred that resistance values of the resistance 11 and the resistance 12 according to the present invention are same as a design value. When the amplifying sections 1A are integrated and manufactured in the driver IC 100, the resistance 11 has a resistance value Rb and the resistance 12 has a resistance value Ra due to manufacturing variation.

In the amplifying section 1A according to the present invention, a first driving mode in which the switches 13 and 14 are turned on and the switches 15 and 16 are turned off (the switch states shown in FIG. 2) and a second driving mode in which the switches 15 and 16 are turned on and the switches 13 and 14 are turned off are switched for every predetermined period. In the first driving mode, the resistance 11 is connected between the inversion input node 22 and the output node 23 in the differential amplifier 10, and the resistance 12 is connected between the inversion input node 22 and the reference voltage line 24. Also, in the second driving mode, the resistance 12 is connected between the inversion input node 22 and the output node 23, and the resistance 11 is connected between the inversion input node 22 and the reference voltage line 24. That is, in the amplifying section 1A according to the present invention, the resistance connected to the inversion input node 22 and the output node 23 in the differential amplifier 10 and the resistance connected to the inversion input node 22 and the reference voltage line are switched for every predetermined period to drive the data line X and the pixels on the display panel. By periodically switching the resistance 11 and the resistance 12 which have manufacturing variation, variation in gain of the amplifying section 1A is cancelled, thereby suppressing the display unevenness.

Hereinafter, an input-output characteristic of the amplifying section 1A according to the present invention will be described. When the switches 13 and 14 are turned on and the switches 15 and 16 are turned off (first driving mode), the input-output characteristic of the amplifying section 1A is expressed by the following equation (3). Here, it is supposed that the resistance value of the resistance 11 is Rb, the resistance value of the resistance 12 is Ra, the reference voltage of the reference voltage line 24 is Vref and the voltage value of the display signal outputted from the output node 23 of the differential amplifier 10 is Vout.

$$V_{out}=(1+R_b/R_a)V_{in}-(R_b/R_a)V_{ref} \quad (3)$$

Also, when the switches 15 and 16 are turned on and the switches 13 and 14 are turned off (second driving mode), the input-output characteristic of the amplifying section 1A is expressed by the following equation (4).

$$V_{out}=(1+R_a/R_b)V_{in}-(R_a/R_b)V_{ref} \quad (4)$$

Here, when the reference voltage Vref is ground voltage GND (0V), the equations (3) and (4) are converted into the following equations (5) and (6), respectively.

$$V_{out}=(1+R_b/R_a)V_{in} \quad (5)$$

$$V_{out}=(1+R_a/R_b)V_{in} \quad (6)$$

When the gain α=1+Rb/Ra and gain β=1+Ra/Rb, the equations (5) and (6) are expressed by the following equations (7) and (8), respectively.

$$V_{out}=\alpha V_{in} \quad (7)$$

$$V_{out}=\beta V_{in} \quad (8)$$

It is preferred that the resistance value Rb of the resistance 11 and the resistance value Ra of the resistance 12 are the same as the design value. Ideally, gain α=gain β=2. However, the gains α and β vary depending on the amplifying section 1A due to the manufacturing variation. For example, when the relative variation between the resistance 11 and the resistance 12 is 6% and Rb=0.94 Ra, Vout becomes 1.940 Vin in the first driving mode (the state shown in FIG. 2). On the other hand, Vout becomes 2.064 Vin in the second driving mode. By alternately switching between the first driving mode and the second driving mode for every predetermined period (for example, every frame time), a pixel voltage (display signal) outputted from the amplifying section 1A and supplied to the pixel is averaged. Thus, the display unevenness is improved. When the relative variation between the resistance 11 and the resistance 12 is 6%, a gain average value (α+β)/2 is 2.002. When the gradation voltage Vin of 1.25 V is supplied to the differential amplifier 10, an average voltage error of the display signal Vout outputted from the output node 23 is 2.4 mV with respect to the ideal voltage of 2.5 V. Thus, the display unevenness is improved.

Consequently, when variation in the display signal Vout outputted from the amplifying section 1A should be suppressed within 5 mV in halftone, the relative variation between the resistance 11 and the resistance 12 up to about 8 to 9% is allowable. For example, when the relative error of the resistance value due to manufacturing variation is 8% (Rb=0.92Ra), the amplifying section 1A switches the display signals Vout between 1.920 Vin and 2.087 Vin. That is, gain time average of the amplifying section 1A is 2.0035. When the gradation voltage Vin supplied to the amplifying section 1A is 1.25 V, the average voltage error is 4.3 mV with respect to the ideal voltage of 2.5 V. This manufacturing variation of 8% can be easily achieved in the semiconductor integrated circuit.

It is preferred that the resistance 11 and the resistance 12 are formed of polysilicon which has no voltage dependence. An analog switch and a well resistance may be used as the resistance 11 and the resistance 12. However, since the analog switch and the well resistance have large voltage dependence, it is unpreferable. It is preferable that polysilicon having the resistance value of about several MΩ/□ is used for the resistance 11 and the resistance 12. Furthermore, it is preferred that the switches 13 to 16 are configured from analog switches such as transistors. The resistance values of the switches 13 to 16 are set to be resistance values smaller than those of the resistances 11 and 12 by one digit or more. For example, when the resistance 11 is 5 MΩ and the resistance 12 is 5 MΩ, on-resistances of the switches 13 to 16 are set to be 500 KΩ or smaller. Like the resistance variation, the on-resistance value of the analog switch also varies due to the manufacturing variation. Even when the on-resistance variation of each switch is 5%, the on-resistance values are smaller than the resistance values of the resistance 11 and 12 by one digit or more. That is, the on-resistances of the switches 13 to 16 vary from the feedback resistance connected to the differential amplifier 10 by only 0.5% or less. However, it is preferable that the relative variation of the resistance values including variation of the on-resistances of the switches 13 to 16 falls within 8 to 9%.

Next, the operation of the amplifying section 1A for driving of the liquid crystal display apparatus will be described. Referring to FIGS. 4A and 4B, and 5A to 5F, the driver IC 100 will be described in the present embodiment, by using a data line drive circuit for performing the line reverse driving as an example. In the present embodiment, a polarity of a common electrode in each pixel is reversed for every line and for every frame. Thus, it is supposed that a voltage range of the display signal Vout outputted from the amplifying section 1A is 0 to 5 V in both of a display signal of a positive polarity and a display signal of the negative polarity. In this case, the range of the gradation voltage Vin supplied to the non-inversion input node 21 is 0 to 2.5 V. FIGS. 4A and 4D are schematic diagrams showing the polarity of the common electrode in each pixel on the display panel in the line reverse driving method. The display panel shown in FIGS. 4A and 4B is assumed to have pixels (of 4 rows×6 columns) at the intersection points of four scan lines Y1 to Y4 and six data lines X1 to X6.

FIGS. 5A to 5F are timing charts showing an operation of the amplifying section 1A for performing the line reverse driving method for the display panel as shown in FIGS. 4A and 4B. Here, an operation of the amplifying sections 1A-1 to 1A-6 connected to the data lines X1 to X6 will be described. In the present embodiment, since all of the amplifying sections 1A-1 to 1A-6 perform a same operation, when they need not be distinguished, the data lines X1 to X6 are deemed as the data line X and the amplifying sections 1A-1 to 1A-6 are deemed as the amplifying section 1A in the following description. Referring to FIGS. 5A to 5F, each of the switches 13 to 17 is turned on in an H level and turned off in an L level.

FIGS. 5A to 5F show a vertical synchronization signal Vsync for determining a vertical interval (frame), a horizontal synchronization signal Hsync for determining a horizontal interval, a polarity signal POL applied to the common electrode, the on/off state of the switches 13 and 14, the on/off state of the switches 15 and 16, and the on/off state of the switch 17. Here, the scan lines Y1 to Y4 are changed according to the horizontal synchronizing signal Hsync. The vertical synchronizing signal Vsync is H for every four horizontal intervals and the polarity of the frame is reversed.

Referring to FIGS. 5A to 5F, in a first horizontal interval and a third horizontal interval (first scanning and third scanning (Y1, Y3)) of a first frame, the polarity signal POL is H, and the amplifying section 1A outputs the display signal Vout of the positive polarity to the data line X. At this time, the switches 13 and 14 are turned on and the switches 15 and 16 are turned off (first driving mode). That is, one end of the resistance 11 and one end of the resistance 12 are commonly connected to the inversion input node 22, the other end of the resistance 11 is connected to the output node 23, and the other end of the resistance 12 is connected to the reference voltage line 24. In the second horizontal interval and the fourth horizontal interval (the second scanning and the fourth scanning (Y2, Y4)), the polarity signal POL is L and the amplifying section 1A outputs the display signal Vout of the negative polarity to the data line X. At this time, the switches 13 and 14 are turned off and the switches 15 and 16 are turned on (second driving mode). That is, one end of the resistance 11 and one end of the resistance 12 are commonly connected to the inversion input node 22, the other end of the resistance 12 is connected to the output node 23 and the other end of the resistance 11 is connected to the reference voltage line 24.

Similarly, in the first scanning and the third scanning (Y1 and Y3) of a second frame, the polarity signal POL is L and the amplifying section 1A outputs the display signal Vout of the negative polarity to the data line X. At this time, as in the first frame, the switches 13 and 14 are turned on and the switches 15 and 16 are turned off (first driving mode). In the second scanning and the fourth scanning (Y2 and Y4), the polarity signal POL is H and the amplifying section 1A outputs the display signal Vout of the positive polarity to the data line X. At this time, as in the first frame, the switches 13 and 14 are turned off and the switches 15 and 16 are turned on (second driving mode).

In the first scanning and the third scanning (Y1 and Y3) of a third frame, the polarity signal POL is H and the amplifying section 1A outputs the display signal Vout of the positive polarity to the data line X. At this time, the switches 13 and 14 are turned off and the switches 15 and 16 are turned on (second driving mode). In the second scanning and the fourth scanning (Y2 and Y4), the polarity signal POL is L and the amplifying section 1A outputs the display signal Vout of the negative polarity to the data line X. At this time, the switches 13 and 14 are turned on and the switches 15 and 16 are turned off (first driving mode).

Similarly, in the first scanning and the third scanning (Y1 and Y3) of the fourth frame, the polarity signal POL is L and the amplifying section 1A outputs the display signal Vout of the negative polarity to the data line X. At this time, as in the third frame, the switches 13 and 14 are turned off and the switches 15 and 16 are turned on (second driving mode). In the second scanning and the fourth scanning (Y2 and Y4), the polarity signal POL is H and the amplifying section 1A outputs the display signal Vout of the positive polarity to the data line X. At this time, as in the third frame, the switches 13 and 14 are turned on and the switches 15 and 16 are turned off (first driving mode).

As described above, the amplifying section 1A switches the first driving mode and the second driving mode for every horizontal interval. That is, in the amplifying section 1A according to the present invention, connection between the resistance 11 and the resistance 12, which determine the amplification factor, and the differential amplifier 10 is switched for every predetermined period. In the amplifying section 1A driving pixels on the same line (for example, scan line Y1), a position of the resistance 11 is switched to a position of the resistance 12 by using the first to fourth frames as one cycle.

It should be noted that in the first horizontal interval (driving the pixels on the scan line Y1), the input-output characteristic of the amplifying section 1A in the first and second frames is Vout=(1+Rb/Ra)Vin. Moreover, the input-output characteristic of the amplifying section 1A in the third and fourth frames is Vout=(1+Ra/Rb)Vin. Here, in case of Ra≈Rb (within 8 to 9% in relative ratio), a variation in display signals Vout of the amplifying sections 1A-1 to 1A-6 falls within 5 mV with respect to an ideal value (in half-tone (Vout=2.5 V)). Accordingly, an excellent image quality without any display unevenness can be obtained. As described above, when certain pixels are driven, by switching positions of the resistances 11 and 12 by using 4 frames as one cycle to drive the data line X on the display panel, the gain variation of the amplifying section 1A is cancelled.

On the other hand, the switch 17 is turned on when the display signal Vout is outputted and turned off in switching of the switches 13 to 16. For this reason, a connection between the amplifying section 1A and one end 8 of the data line X is temporarily put into a high impedance state, thereby preventing occurrence of an inappropriate voltage (glitch) supplied to the data line X.

Since a voltage supplied to the non-inversion input node 21 of the differential amplifier 10 may be a half of the liquid crystal drive voltage, the operation voltages of the D/A converting section 2 and the gradation voltage generating section 4 may be also a half of the liquid crystal drive voltage. For example, when the voltage range of the display signal Vout outputted from the amplifying section 1A is 0 to 5 V in both of the display signal of the positive polarity and the display signal of the negative polarity, the range of the gradation voltage Vin supplied to the non-inversion input node 21 may be 0 to 2.5 V. Thus, the D/A converting section 2 and the gradation voltage generating section 4 can be formed from a low breakdown voltage element, thereby reducing in size. Furthermore, since the operation voltages of the D/A converting section 2 and the gradation voltage generating section 4 are reduced, the consumed power can be reduced.

Second Embodiment

Figure 6:
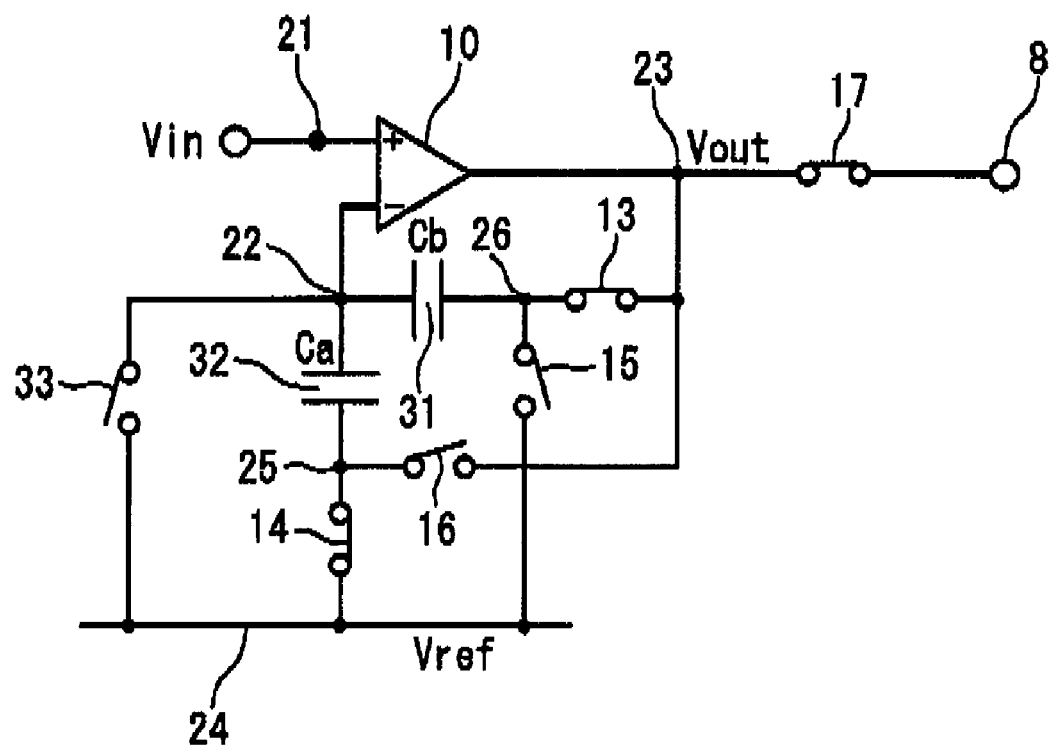
FIG. 6 is a circuit diagram showing the configuration of the amplifying section according to a second embodiment of the present invention.

FIG. 6 is a circuit diagram showing the configuration of the amplifying section 1B according to the second embodiment of the present invention. Referring to FIG. 6, the driver IC 100 in the second embodiment has configuration in which an amplifying section 1B is provided as the above-mentioned amplifying section 1. The amplifying section 1B has a capacitance 31 and a capacitance 32 in place of the resistance 11 and the resistance 12 in the amplifying section 1A in the first embodiment, respectively. A switch 33 is provided between the inversion input node 22 of the differential amplifier 10 connected to ends of the capacitance 31 and the capacitance 32 and the reference voltage line 24. Hereinafter, since components having the same reference numerals as those of the first embodiment have the same configuration and operations, description thereof is omitted.

In the amplifying section 1B according to the second embodiment, as in the first embodiment, the first driving mode in which the switches 13 and 14 are turned on and the switches 15 and 16 are turned off (the switch state shown in FIG. 6) and the second driving mode in which the switches 15 and 16 are turned on and the switches 13 and 14 are turned off are switched for every predetermined period. In this manner, in the first driving mode, the capacitance 31 is connected between the inversion input node 22 and the output node 23 in the differential amplifier 10, and the capacitance 32 is connected between the inversion input node 22 and the reference voltage line 24. Moreover, in the second driving mode, the capacitance 32 is connected between the inversion input node 22 and the output node 23 and the capacitance 31 is connected between the inversion input node 22 and the reference voltage line 24. That is, in the amplifying section 1B according to the second embodiment, the capacitance connected to the inversion input node 22 and the output node 23 in the differential amplifier 10 and the capacitance connected to the inversion input node 22 and the reference voltage line are switched for every predetermined period to drive the data line X and the pixels on the display panel. By periodically switching the capacitance 31 and the capacitance 32 which have the manufacturing variation, a variation in gain of the amplifying section 13 is cancelled, thereby suppressing the display unevenness.

Hereinafter, the input-output characteristic of the amplifying section 13 according to the second embodiment of the present invention will be described. When the switches 13 and 14 are turned on and the switches 15 and 16 are turned off (first driving mode), the input-output characteristic of the amplifying section 1B is expressed by the following equation (9). Here, a capacitance value of the capacitance 31 is Cb, a capacitance value of the capacitance 32 is Ca, a reference voltage of the reference voltage line 24 is Vref and a voltage value of the display signal outputted from the output node 23 of the differential amplifier 10 is Vout.

$$V_{out} = (1+C_a/C_b)V_{in} - (C_a/C_b)V_{ref} \quad (9)$$

When the switches 15 and 16 are turned on and the switches 13 and 14 are turned off (second driving mode), the input-output characteristic of the amplifying section 1B is expressed by the following equation (10).

$$V_{out} = (1+C_b/C_a)V_{in} - (C_b/C_a)V_{ref} \quad (10)$$

In comparison with the first embodiment, this shows characteristic in which Ra and Rb are replaced as follows Ra with 1/Ca and Rb with 1/Cb.

Here, given that the reference voltage Vref is ground voltage GND (0V), the equations (9) and (10) become the equations (11) and (12), respectively.

$$V_{out} = (1+C_a/C_b)V_{in} \quad (11)$$

$$V_{out} = (1+C_b/C_a)V_{in} \quad (12)$$

It is preferred that the capacitance value Cb of the capacitance 11 and the capacitance value Ca of the capacitance 12 are same as a design value. Ideally, a gain value in both the driving modes is 2. However, the gain values vary depending on the amplifying section 1B due to the manufacturing variation. However, as in the first embodiment, even the capacitance values vary due to the manufacturing variation, by switching the switches 13 to 16 for every frame to switch positions of the capacitances, the gain variation of the amplifying section 1B can be cancelled.

In the first embodiment, it is better that the on-resistances of the switches 13 to 16 are smaller. That is, it is preferred to shorten the gate length L of the transistors used as the switches 13 to 16 and widen the gate width W as much as possible. However, it is preferred that the gate area (L×W) of the transistor is set to be small as much as possible in the switches 13 to 16 in the second embodiment. The reason is as follows. In the first embodiment using the resistance elements as a feedback circuit of the differential amplifier 10, since current constantly flows out from the output node 23 to the reference voltage line 24, the on-resistance values of the switches 13 to 16 have an effect on the input-output characteristic of the amplifying section 1A. On the other hand, in the present embodiment using the capacitative elements as the feedback circuit, since a current does not flow to the capacitances 31 and 32 constantly, even large on-resistance values of the switches 13 to 16 has no effect on the gain.

Next, an operation of the amplifying section 1B in the second embodiment in driving of the liquid crystal display apparatus are the same as those in the first embodiment except that the operation of the switch 33 is added and operations of the switches 14 and 15 are partially changed. Here, to obtain the input-output characteristic shown in the above equations (9) and (10) in the amplifying section 1B, initially, the capacitance 31 and the capacitance 32 need to be equal to each other in an electric charge quantity. Thus, prior to the operation, the electric charge quantity is made 0 by setting each of the nodes of the capacitance 31 and the capacitance 32 to the same voltage through control of the switch 33. Describing in detail, in power-on and each vertical interval (Vsync), the switch 33 allows the switches 14, 15 and 33 to be simultaneously turned on to make electric charge quantity of the capacitances 31 and 32 to be 0. Then, the switch 33 is turned off and the same operations as in the first embodiment are carried out.

When the switches 14, 15 and 33 are turned off, the electric charge of the capacitance 31 may be different from that of the capacitance 32 due to switching noise (feed-through). For this reason, it is preferred that parasitic capacitances of the switches 13 to 16 and 33 provided in the amplifying section 1B are set to be small as much as possible. Alternatively, a dummy switch, the gate area of which is one half of the gate area of the switch 33, may be connected to the inversion input node 22 and operated in a reverse phase to the switch 33.

Figure 7:
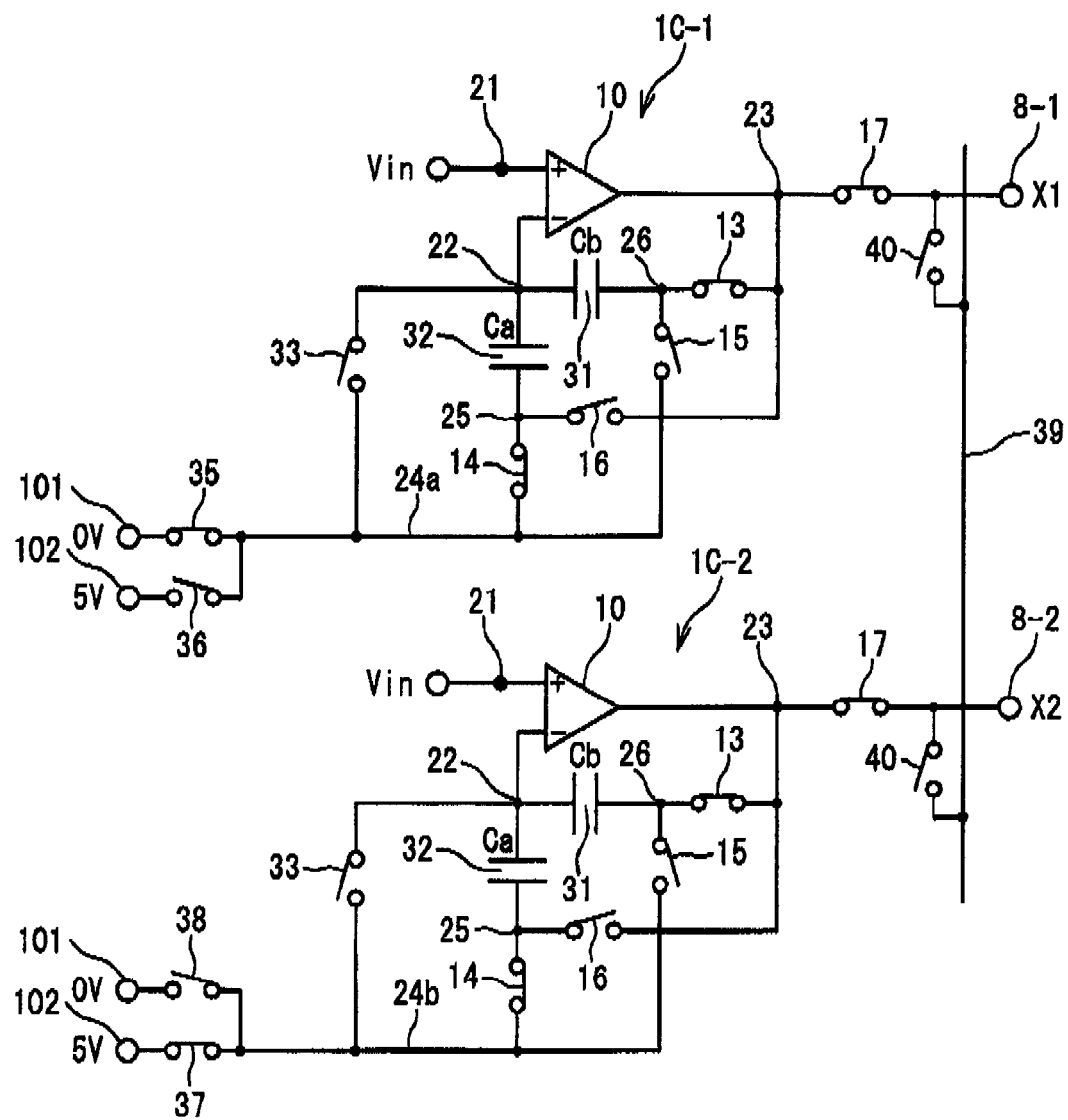
FIG. 7 is a circuit diagram showing the configuration of the amplifying section according to a third embodiment of the present invention.

As described above, even in the configuration in which the feedback circuit including the capacitative elements is connected to the differential amplifier 10 according to the present invention, the gain variation caused by the manufacturing variation can be averaged by switching between two capacitative elements by use of the Third Embodiment FIG. 7 is a circuit diagram showing the amplifying section IC according to the third embodiment of the present invention. In the first embodiment, a line reverse driving of reversing the polarity of the voltage applied to the common electrode in the liquid crystal panel will be described. However, in the third embodiment, the driver IC 100 achieving the dot reverse driving will be described. The dot reverse driving is a method in which a liquid crystal common voltage is fixed, adjacent data lines X have different polarities and the polarity is reversed for every line and frame. The driver IC 100 in the third embodiment has amplifying sections 1C-1 and 1C-2 outputting display signals Vout of different polarities as the amplifying sections 1-1 and 1-2 for driving adjacent data lines X-1 and X-2. Referring to FIGS. 7 to 9, the configuration and operations of the adjacent amplifying sections 1C-1 and 1C-2 will be described. Needless to say, the amplifying sections 1C-1 and 1C-n have the same configuration and operations as the amplifying sections 1C-1 and 1C-n. Since components with the same reference numerals as those in the first and second embodiments have the same configuration and operations, description thereof is omitted.

FIG. 7 is a circuit diagram showing the configuration of the amplifying sections 1C-1 and 1C-2 in the third embodiment. Referring to FIG. 7, the amplifying section 1C-1 has the configuration in which the reference voltage line 24 is replaced with a reference voltage line 24a and a switch 40 connected to a common line 39 is provided in the configuration of the amplifying section 1B in the second embodiment. The amplifying section 1C-2 has the configuration in which the reference voltage line 24 is replaced with a reference voltage line 24b and a switch 40 connected to the common line 39 is provided in the configuration of the amplifying section 1B in the second embodiment. The driver IC 100 in the present embodiment has switches 35 to 38 as polarity switching circuits. The is reference voltage line 24a is connected to power supply terminals 101 and 102 through the switches 35 and 36, respectively. The reference voltage line 24b is connected to power supply terminals 102 and 101 through the switches 37 and 38. 0 V as the reference voltage Vref is supplied to the power supply terminal 101 and 5 V as the reference voltage Vref is supplied to the power supply terminal 102. A node between the switch 17 and the driver output node 8 in each of the amplifying sections 1C-1 and 1C-2 is connected to the common line 39 through the switch 40. The switch 40 is turned on before the polarity of the data line X is changed from a positive polarity to a negative polarity or from the negative polarity to the positive polarity to neutralize an electric charge of each data line X. It should be noted that the differential amplifier 10, the switches 13 to 17, 35 to 38 and 40 and the capacitance 31 and 32 are formed of a high breakdown voltage element (10 V).

Figures 8A, 8B:
FIGS. 8A and 8B are diagrams showing the polarity of each pixel on the display panel in a dot reverse driving method.

FIGS. 8A and 8B are schematic diagrams showing polarity change of the display signal applied to each pixel on the display panel through the dot reverse driving. Here, the display panel shown in FIG. 4 is assumed to have pixels (if 4 rows×6 columns) connected to intersection points of scan lines Y1 to Y4 and data lines X1 to X6. The voltage range of the display signal Vout outputted from the amplifying section 1C for the dot reverse driving is 0 to 5 V on a positive polarity side and −5 to 0 V on a negative polarity side. That is, in response to the input gradation voltage Vin (0 to 2.5 V), the amplifying section IC outputs the display signal Vout of −5 to 5 V. When the display signal of the positive polarity is outputted, 0 V as the reference voltage Vref is supplied to the amplifying section 1C. When the display signal of the negative polarity is outputted, 5 V as the reference voltage Vref is supplied to the amplifying section 1C. In the dot reverse driving, the display signal Vout of the positive polarity and the display signal Vout of the negative polarity are outputted to the same line (scan line Y) simultaneously. Thus, in the driver IC 100 in the present embodiment, the above-mentioned two kinds of reference voltage lines 24a and 24b are alternately provided and different reference voltages Vref are supplied to the reference voltage lines 24a and 24b. For example, the reference voltage line 24a is connected to the amplifying section IC having an odd sequential number and the reference voltage line 24b is connected to the amplifying section 1C having an even sequential number. The reference voltages Vref (0 V or 5 V) are supplied to the reference voltage lines 24a and 24b, respectively, by the switches 35 to 38 provided as the polarity switching circuits.

Next, the operations of the polarity switching circuits (switch 35 to 38) will be described. When the switch 35 is turned on, 0 V is supplied to the reference voltage line 24a and the display signal Vout of the positive polarity is outputted from the driver output node 8-1 connected to the amplifying section 1C-1. At the same time, the switch 37 is turned on, 5 V is supplied to the reference voltage line 24b and the display signal Vout of the negative polarity is outputted from the driver output node 8-2 connected to the amplifying section 1C-2. Similarly, when the switch 36 is turned on, 5 V is supplied to the reference voltage line 24a and the display signal Vout of the negative polarity is outputted from the driver output node 8-1 connected to the amplifying section 1C-1. Also, at the same time, the switch 38 is turned on, 0 V is supplied to the reference voltage line 24b and the display signal Vout of the positive polarity is outputted from the driver output node 8-2 connected to the amplifying section 1C-2. It is assumed that the switch 17 is turned on when the display signal Vout is outputted.

Referring to FIGS. 9A to 9P, operations of the amplifying sections 1C-1 and 1C-2 in the third embodiment will be described. FIGS. 9A to 9P are timing charts showing the operations of the amplifying sections 1C-1, 1C-2 for performing the dot reverse driving with respect to the display panel shown in FIGS. 8A and 8B. Here, the operations of the amplifying sections 1C-1 and 1C-2 which are connected to the data lines X1 and X2 will be described. Referring to FIGS. 9A to 9P, each of the switches 13 to 17, 35 to 38 and 40 is turned on in H level and turned off in L level.

FIGS. 9A to 9P show the vertical synchronization signal Vsync for deciding a vertical interval (frame), the horizontal synchronization signal Vsync for deciding a horizontal interval, on/off states of the switches 13 and 14, on/off states of the switches 15 and 16, an on/off state of the switch 17, on/off states of the switches 35 and 37, on/off states of the switches 36 and 38, an on/off state of the switch 40, a polarity of the display signal Vout outputted to the data line X1, a polarity of the display signal Vout outputted to the data line X2 and scan signals outputted to the scan lines Y1 to Y4. Here, the driven scan lines Y1 to Y4 are changed according to the horizontal synchronization signal Hsync. The vertical synchronization signal Vsync is H for every 4 horizontal intervals and a polarity of the frame is reversed.

Referring to FIGS. 9A to 9P, the amplifying section 1C-1 which outputs the display signal Vout to the data line X1 will be described. For simplification of description, the state in which the switches 13, 14, and 35 are turned on and the switches 15, 16, and 36 are turned off is abbreviated as (positive polarity, first driving mode), the state in which the switches 13, 14, and 36 are turned on and the switches 15, 16, and 35 are turned off is abbreviated as (negative polarity, first driving mode), the state in which the switches 15, 16, and 35 are turned on and the switches 13, 14, and 36 are turned off is abbreviated as (positive polarity, second driving mode) and the state in which the switches 15, 16, and 36 are turned on and the switches 13, 14, and 35 are turned off is abbreviated as (negative polarity, second driving mode).

First, the pixel (1, 1) provided in an intersection point of the data line X1 and the scan line Y1 will be described. The configuration of the amplifying section 1C-1 in driving of the pixel (1, 1) is (positive polarity, first driving mode) in the first frame, (negative polarity, first driving mode) in the second frame, (positive polarity, second driving mode) in the third frame and (negative polarity, second driving mode) in the fourth frame.

Next, the amplifying section 1C-2 which outputs the display signal Vout to the data line X2 will be described. For simplification of description, the state in which the switches 13, 14, and 37 are turned on and the switches 15, 16, and 38 are turned off is abbreviated as (negative polarity, first driving mode), the state in which the switches 13, 14, and 38 are turned on and the switches 15, 16, and 37 are turned off is abbreviated as (positive polarity, first driving mode), the state in which the switches 15, 16, and 37 are turned on and the switches 13, 14, and 38 are turned off is abbreviated as (negative polarity, reversed position) and the state where the switches 15, 16, and 38 are turned on and the switches 13, 14, and 37 are turned off is abbreviated as (positive polarity, reversed position).

The pixel (2, 1) provided in an intersection point of the data line X2 and the scan line Y1 will be described. The configuration of the amplifying section 1C-2 in driving of the pixel (2, 1) is (negative polarity, first driving mode) in the first frame, (positive polarity, first driving mode) in the second frame, (negative polarity, second driving mode) in the third frame and (positive polarity, second driving mode) in the fourth frame.

In a similar manner, the amplifying sections 1C-1 and 1C-2 change their configuration for every frame to drive the pixels. The amplifying section 1C in the present embodiment switches the polarity of the reference voltage Vref to be applied for each frame with respect to the same pixel and switches the first driving mode and the second driving mode for every two frames. That is, the amplifying section 1C reverses the polarity of the display signal Vout for every frame with respect to the same pixel, and switches the position (gain) of the capacitances in the feedback circuit each time the display signal Vout of the same polarity is outputted to drive the pixel.

In the present embodiment employing the dot reverse driving, when the display signal Vout of the negative polarity is outputted, the reference voltage Vref of 5 V is supplied to the amplifying section 1C. As a result, an error from the ideal values becomes larger. However, when a variation in a capacitance ratio of the capacitance 31 to the capacitance 32 is restricted to about 6%, the display unevenness in halftone can be prevented from occurring. For example, in half-tone of the display signal Vout of the negative polarity (Vout is about −2.5 V), when the gradation voltage is Vin 1.25 V, the reference voltage is Vref=5 V, and Ca=0.94Cb, Vout=−2.2750 V is obtained according to the equation (9) in (negative polarity, first driving mode), and Vout=−2.740 V is obtained according to the equation (10) in (negative polarity, reversed position). As a result, an average value is −2.5075 V, and the error of 7.5 mV is caused from the ideal value of −2.5 V. When the display signal Vout of the positive polarity is outputted, the reference voltage of 0 V is supplied. Thus, in a similar manner, when calculating based on the equations (11) and (12), the error is about 2.5 mV. Accordingly, when the display signal Vout of the positive polarity and the display signal Vout of the negative polarity are averaged, the error from the ideal value becomes about 5 mV. In this manner, the driver IC 100 having the amplifying sections IC according to the present invention can prevent the display unevenness of the display panel.

Fourth Embodiment

Figure 10:
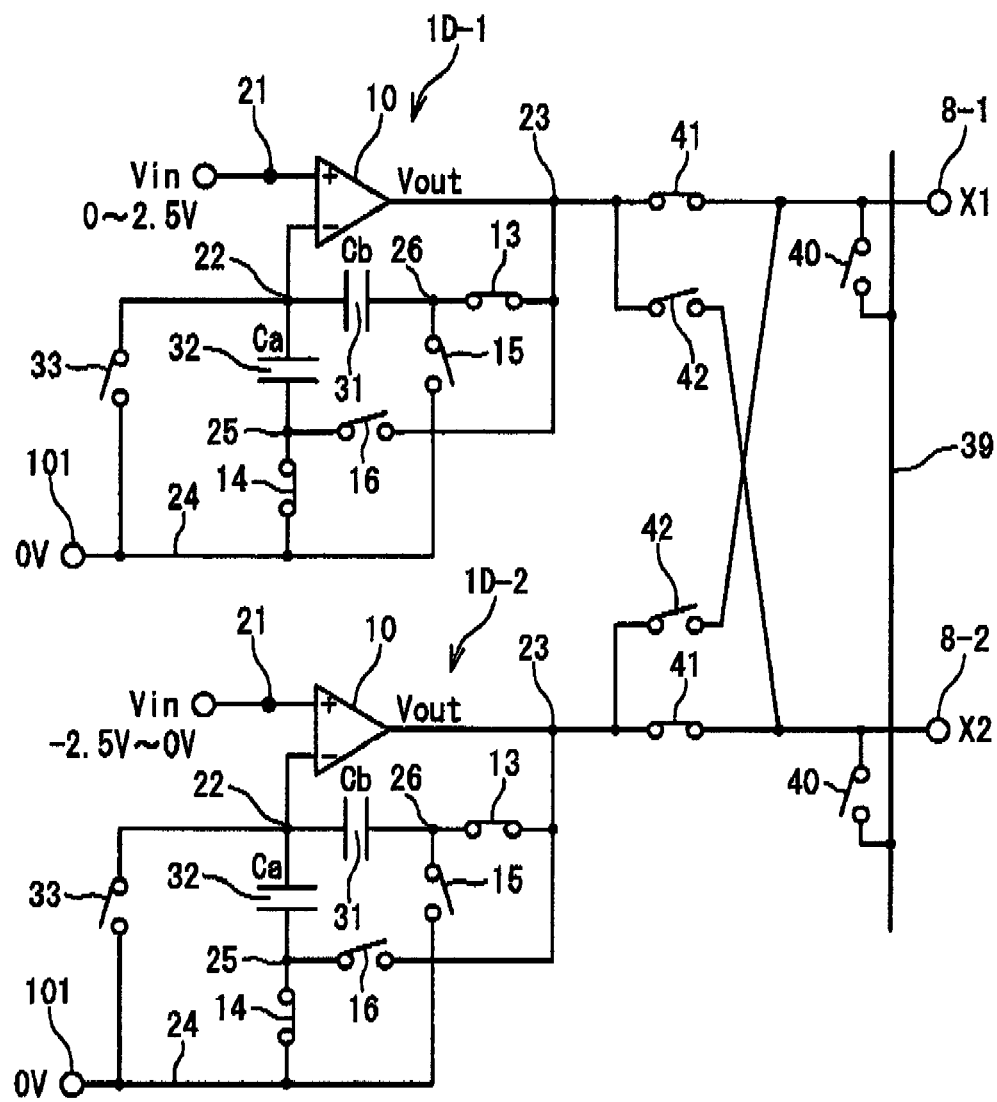
FIG. 10 is a circuit diagram showing the configuration of the amplifying section according to a fourth embodiment of the present invention.

FIG. 10 is a circuit diagram showing the amplifying section 1 according to the fourth embodiment of the present invention. In the fourth embodiment, as in the third embodiment, the driver IC 100 for performing the dot reverse driving will be described. The driver XC 100 in the fourth embodiment has amplifying sections 1D-1 and 1D-2 which output display signals Vout of different polarities as the amplifying sections 1D-1 and 1D-2 driving the adjacent data lines X-1 and X-2. Hereinafter, referring to FIG. 10, the configuration and operations of the adjacent amplifying sections 1D-1 and 1D-2 will be described. Needless to say, the amplifying sections 1D-n−1 and 1D-n have the same configuration and operations as the amplifying sections 1D-1 and 1D-n. Since components with the same reference numerals as those in the first to third embodiments have the same configuration and operations, description thereof is omitted.

Referring to FIG. 10, the amplifying section 1D has the polarity switching circuit in place of the switch 17 and the switch 40 connected to the common line 39 in the configuration of the amplifying section 1B in the second embodiment. The polarity switching circuit includes a switch 41 and a switch 42, ends of which are commonly connected to the output node 23. The other end of the switch 41 in the amplifying section 1D-1 is connected to the data line X1 through the driver output node 8-1 and connected to the other end of the switch 42 of the amplifying section 1D-2. The other end of the switch 42 in the amplifying section 1D-1 is connected to the data line X2 through the driver output node 8-2. Similarly, the other end of the switch 41 in the amplifying section 1D-2 is connected to the data line X2 through the driver output node 8-2 and connected to the other end of the switch 42 in the amplifying section 1D-1. The other end of the switch 42 in the amplifying section 1D-2 is connected to the data line X2 through the driver output node 8-1. The gradation voltage Vin of 0 to 2.5 V is supplied to the non-inversion input node 21 in the amplifying section 1D-1 and the gradation voltage vin of −2.5 to 0 V is supplied to the non-inversion input node 21 in the amplifying section 1D-2. The reference voltage Vref of 0 V is supplied to the power supply terminal 101 in each amplifying section 1D. A node between the switch 41 and the driver output node 8 in each amplifying section 1D is connected to the common line 39 through the switch 40. As in the third embodiment, the switch 40 is turned on before the polarity of the data line X is changed from the positive polarity to the negative polarity or from the negative polarity to the positive polarity to neutralize the electric charge of each data line X.

In the present embodiment, the gradation voltage Vin (0 to 2.5 V) and the reference voltage Vref (0 V) are supplied to the amplifying section 1D having an odd sequential number added to the reference numeral (for example, the amplifying section 1D-1) and the display signal Vout of the positive polarity (0 to 5 V) is outputted. On the other hand, the gradation voltage Vin (−2.5 to 0 V) and the reference voltage Vref (0 V) are supplied to the amplifying section 1D having an even sequential number added to the reference numeral (for example, the amplifying section 1D-2) and the display signal Vout of the negative polarity (−5 to 0 V) is outputted. That is, the differential amplifier 10, the switches 13 to 16, and 33 and the capacitances 31 and 32 in the amplifying section 1D-1 operate in a range of 0 to 5 V or −5 to 0 V. At this time, the differential amplifier 10, the switches 13 to 16, and 33 and the capacitances 31 and 32 in the amplifying section 1D-2 operate in a range of −5 to 0 V. The D/A converting section 2-1 and the gradation voltage generating section 4 which are connected to the amplifying section 1D-1 operate in the range of 0 to 2.5 V. Similarly, the D/A converting section 2-2 and the gradation voltage generating section 4 which are connected to the amplifying section 1D-2 operate in the range of −2.5 to 0 V. The switches 40 to 42 operate in a range of −5 to 5 V. Thus, it is preferred that the switches 40 and 41 are formed of the high breakdown voltage element (10 V).

As described above, the driver IC 100 in the present embodiment has the amplifying section 1D which outputs the display signal Vout of fixed polarity and can reverse the polarity of the display signal Vout outputted to the data line X and pixel by switching the data line X through the switches 41 and 42 as the polarity switching circuits. In the present embodiment, since the polarity switching circuit is provided in the amplifying section, the number of elements is increased in comparison with the third embodiment. However, since the differential amplifier 10, the switches 13 to 16, and 33 and the capacitance 31 and 32 are formed from a medium-breakdown voltage element (5 V), the circuit area can be reduced by integration.

Figure 11:
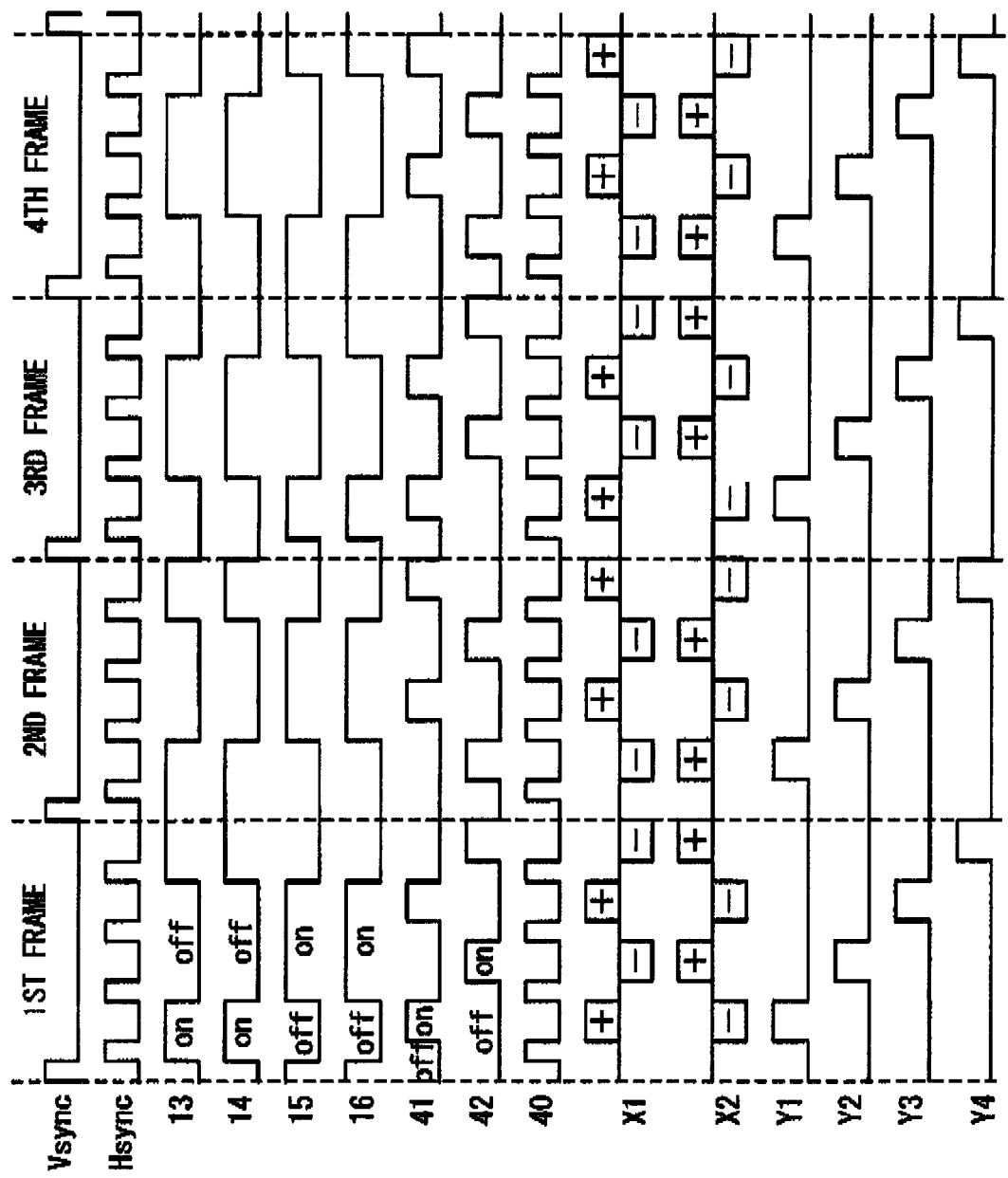
FIGS. 11A to 11O are timing charts showing an driving operation of a data line by the amplifying section according to the fourth embodiment of the present invention.

Next, referring to FIGS. 11A to 11O, operations of the amplifying sections 1D-1 and 1D-2 in the fourth embodiment will be described. FIGS. 11A to 11O are timing charts showing operations of the amplifying sections 1D-1 and 1D-2 performing the dot reverse driving for the display panel shown in FIGS. 8A and 8B. FIGS. 11A to 11O show the vertical synchronization signal Vsync for deciding a vertical interval (frame), the horizontal synchronization signal Vsync for deciding a horizontal interval, the on/off states of the switches 13 and 14, the on/off state of the switches 15 and 16, an on/off state of the switch 41, the on/off states of the switch 42, the on/off state of the switch 40, the polarity of the display signal Vout outputted to the data line X1, the polarity of the display signal Vout outputted to the data line X2 and scan signals outputted to the scan lines Y1 to Y4. Here, the scan lines Y1 to Y4 are changed according to the horizontal synchronization signal Hsync. Also, the vertical synchronization signal Vsync is H every 4 horizontal intervals and the polarity of the frame is reversed.

Referring to FIGS. 11A to 11O, when the switch 41 is turned on, the switch 42 is turned off. At this time, the amplifying section 1D-1 is connected to the data line X1 and the amplifying section 1D-2 outputs the output signal Vout to the data line X2 (first connection pattern). When the switch 41 is turned off, the switch 42 is turned on. At this time, the amplifying section 1D-1 is connected to the data line X2 and the amplifying section 1D-2 outputs the display signal Vout to the data line X1 (the second connection pattern).

The display signal Vout outputted to the pixels (1, 1), (2, 1) provided in the intersection points of the data lines X1 and X2 and the scan lines Y1 will be described. In the first scanning in the first frame, the amplifying section 1D assumes the first driving mode and the first connection pattern. In the first scanning in the second frame, the amplifying section 1D assumes the first driving mode and the second connection pattern. In the first scanning in the third frame, the amplifying section 1D assumes the first driving mode and the first connection pattern. In the first scanning in the fourth frame, the amplifying section 1D assumes the first driving mode and the second connection pattern. In this manner, as the amplifying section 1D which outputs the display signal Vout to the pixel (1, 1), switching is made between the amplifying section 1D-1 and the amplifying section 1D-2 for every frame to reverse the polarity. At this time, the driving mode of each amplifying section 1D is switched between the first driving mode and the second driving mode for every 2 frames. That is, the amplifying section 1D alternately switches between the first driving mode and the second driving mode to drive the data line X and the pixel.

Fifth Embodiment

Figure 12:
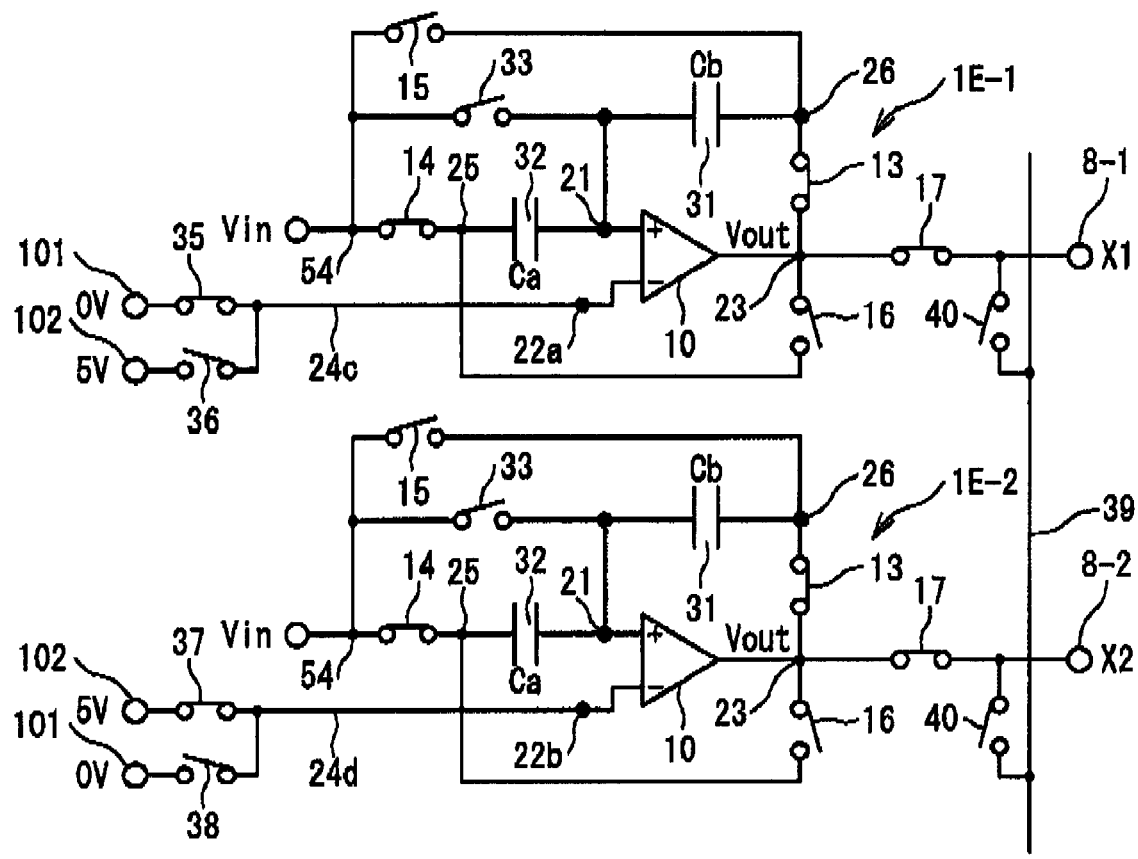
FIG. 12 is a circuit diagram showing the configuration of the amplifying section according to a fifth embodiment of the present invention.
Figure 13:
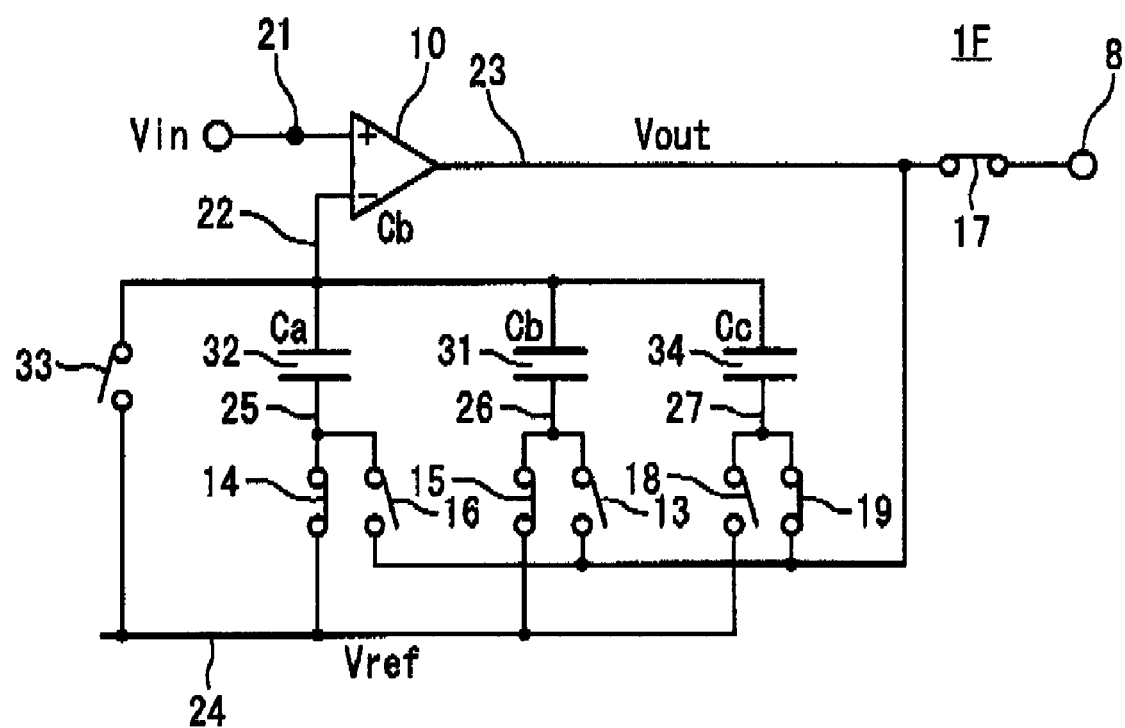
FIG. 13 is a circuit diagram showing the configuration of the amplifying section according to a sixth embodiment of the present invention.

Referring to FIG. 12, the amplifying section 1 according to the fifth embodiment of the present invention will be described. In the fifth embodiment, as in the third embodiment, the driver IC 100 for performing the dot reverse driving will be described. In the amplifying section 1E in the fifth embodiment, the feedback circuit is connected to the non-inversion input node 21 and gain is −1. The driver IC 100 in the fifth embodiment has amplifying sections 1E-1 and 1E-2 which output display signals Vout of different polarities as the amplifying sections 1-1 and 1-2 driving the adjacent data lines X-1 and X-2. The amplifying sections 1E-1 and 1E-2 in the fifth embodiment has the configuration in which the feedback circuits connected to the differential amplifier 10 in the amplifying sections 1C-1 and 1C-2 in the third embodiment are provided between the non-inversion input node 21 and the output node 23. Describing in detail, the feedback circuit (capacitances 31 and 32), the polarity switching circuit (switch 13 to switch 16) and the switch 33 are provided between the non-inversion input node 21 and the output node 23 of the differential amplifier 10. Hereinafter, referring to FIG. 12, configuration and operations of the adjacent amplifying sections 1E-1 and 1E-2 will be described. Needless to say, the amplifying sections 1E-n−1 and 1E-n have the same configuration and operations as the amplifying sections 1E-1 and 1E-n. Since components with the same reference numerals as those in the first to third embodiments have the same configuration and operations, description thereof is omitted.

Referring to FIG. 12, ends of the capacitance 31 and capacitance 32 are commonly connected to the non-inversion input node 21 of the differential amplifier 10. The other end of the capacitance 31 is connected to the output node 23 of the differential amplifier 10 through the switch 13 and connected to an input terminal 54 to which the gradation voltage Vin is supplied through the switch 15. The other end of the capacitance 32 is connected to the output node 23 through the switch 16 and connected to the input terminal 54 through the switch 14. Ends of the capacitance 31 and the capacitance 32 which are connected to the non-inversion input node 21 are connected to the input terminal 54 through the switch 33. The inversion input node 22a of the differential amplifier 10 in the amplifying section 1E-1 is connected to the reference voltage line 24c. The inversion input node 22b of the differential amplifier 10 in the amplifying section 1E-2 is connected to the reference voltage line 24d. The reference voltage line 24c is connected to the power supply terminals 101 and 102 through the switches 35 and 36, respectively. The reference voltage line 24d is connected to the power supply terminals 102 and 101 through the switches 37 and 38, respectively. Here, the reference voltage Vref of 0 V is supplied to the power supply terminal 101. The reference voltage Vref of 5 V is supplied to the power supply terminal 102.

Hereinafter, an input-output characteristic of the amplifying section 1E according to the present invention will be described. When the switches 13 and 14 are turned on and the switches 15 and 16 are turned off (first driving mode), the input-output characteristic of the amplifying section 1E is expressed by the following equation (13). Here, the capacitance value of the capacitance 31 is Cb, the capacitance value of the capacitance 32 is Ca, the reference voltage of the reference voltage line 24a or 24b is Vref and the voltage value of the display signal outputted from the output node 23 of the differential amplifier 10 is Vout.

$$V_{out} = -(C_a/C_b)V_{in} + (1 + C_a/C_b)V_{ref} \quad (13)$$

When the switches 15 and 16 are turned on and the switches 13 and 14 are turned off (second driving mode), the input-output characteristic of the amplifying section 1B is expressed by the following equation (14).

$$V_{out} = -(C_b/C_a)V_{in} + (1 + C_b/C_a)V_{ref} \quad (14)$$

Here, to output the display signal Vout of the positive polarity in a range of 0 to 5 V, the gradation voltage Vin is in a range of 0 to 5 V and the reference voltage Vref of −2.5 V is set, in the voltage range −5 to 5 V of the display signal Vout. To output the display signal of the negative polarity of −2.5 V, the gradation voltage Vin is in a range of 0 to 5 V and the reference voltage Vref of 0 V is supplied. Consequently, the D/A converting section 2 and the gradation voltage generating section 4 in the present embodiment can be formed from medium breakdown voltage elements.

Since operations of the amplifying section 1E in the fifth embodiment are the same as those of the amplifying section 1C in the third embodiment, description thereof is omitted. That is, the amplifying section 1E reverses the polarity of the display signal Vout for each frame to the same pixel and switches positions (gain) of the capacitances in the feedback circuit each time the display signal Vout of the same polarity is outputted to drive the pixel. For this reason, a variation in the output signals Vout in each amplifying section 1E due to manufacturing variation can be averaged, thereby suppressing display unevenness.

Sixth Embodiment

The amplifying section 1F has capacitances 31, 32 and 33 in the amplifying section 1A in the first embodiment, respectively. A common node, to which one end of each of capacitances 31, 32 and 34 is connected, is connected to the inversion input node 22 of the differential amplifier 10, and a switch 33 is provided between the inversion input node 22 of the differential amplifier 10 and the reference voltage line 24. The other end 25 of the capacitance 32 is connected to the reference voltage line 24 through a switch 14 and to the output node 23 of the differential amplifier 10 through a switch 16. The other end 26 of the capacitance 31 is connected to the reference voltage line 24 through a switch 15 and to the output node 23 of the differential amplifier 10 through a switch 13. The other end 27 of the capacitance 34 is connected to the reference voltage line 24 through a switch 18 and to the output node 23 of the differential amplifier 10 through a switch 19. Hereinafter, since components having the same reference numerals as those of the first embodiment have the same configuration and operations, description thereof is omitted.

Figure 14A:
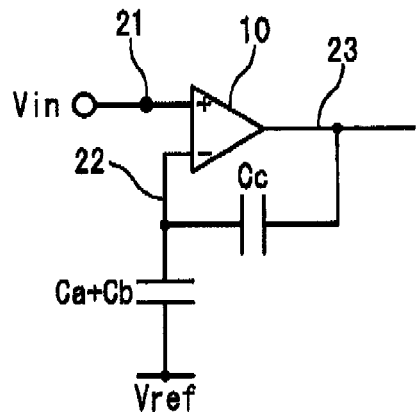
FIGS. 14A to 14C are circuit diagrams showing the operation of the amplifying section according to the sixth embodiment of the present invention.
Figure 14B:
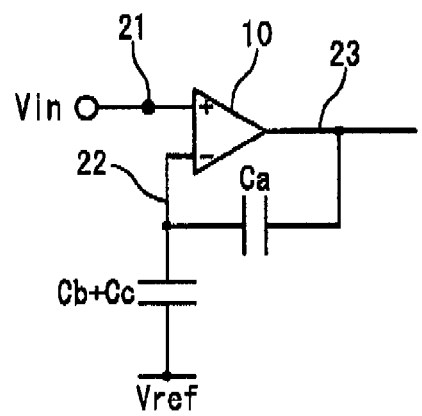
Figure 14C:
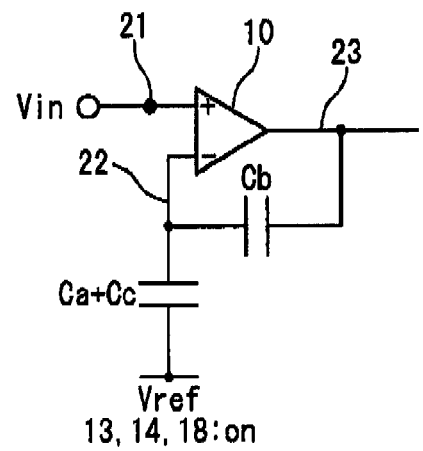

In the operation, the switches 14, 15 and 19 are turned on, and the other switches are turned off. Thus, the state shown in FIG. 14A is accomplished. Also, the switches 15, 16 and 18 are turned on, and the other switches are turned off. Thus, the state shown in FIG. 14B is accomplished. Moreover, the switches 13, 14 and 18 are turned on, and the other switches are turned off. Thus, the state shown in FIG. 14C is accomplished. This cycle is carried out one more. Thus, the average over six frames is obtained.

In the above description, the cycle is from FIG. 14A, to FIG. 14B and to FIG. 14C. However, this cycle may be from FIG. 14C, to FIG. 14B and to FIG. 14A.

According to the conventional example, the manufacturing variation of the resistance elements or the capacitative elements which are provided in the amplifying section needs to be made 0.4% or smaller. However, according to the present invention, when the variation of the resistance elements or the capacitative elements is 8 to 9% or smaller in the line reverse driving method, and the variation of the resistance elements or the capacitative elements is 6% or smaller in the dot reverse driving method, the gain variation of the amplifying section can be cancelled in terms of time. Thus, an excellent image quality without the display unevenness can be obtained.

In the first to fifth embodiments, the display signal Vout outputted from the amplifying sections 1A and 1B according to the line reverse driving method is in a range of 0 to 5 V and the display signal Vout outputted from the amplifying sections 1C to 1E according to the dot reverse driving method is in a range of −5 to 5 V. However, the voltage range is not limited to them. The elements are not limited to a low breakdown voltage element (2.5 V), the medium breakdown element (5 V) and the high breakdown voltage element (10 V).

However, although the embodiments of the present invention have been described in detail, a specific configuration is not limited to the above-mentioned embodiments. If modifications which do not deviate from the subject matter of the present invention are included in the present invention. Although in the amplifying sections 1C to 1E in the third to fifth embodiments use the capacitance 31 and the capacitance 32 as the feedback circuit, the resistance 11 and the resistance 12 may be provided as the feedback circuit. In this case, the circuit configuration of the amplifying section 1A in the first embodiment is adopted. In the first to fifth embodiments, although the switching between the first driving mode and the second driving mode is made on a predetermined period, switching may be made at ay time. However, since the manufacturing variation of the amplifying section 1 can be averaged, it is more preferred that switching of the driving mode is made on a predetermined cycle.

What is claimed is:

1. An amplifier circuit comprising:
   an amplifier having first and second input nodes and one output node; and
   a feedback circuit including at least a first element and a second element and first, second, third, and fourth switches,
   wherein:
   one end of said first and second elements is connected directly with said first input node,
   the other end of said first element is connected with one end of said first and second switches,
   the other end of said second element is connected with one end of said third and fourth switches,
   the other end of said first and third switches is connected with said output node when said first and third switches are on,
   the other end of said second and fourth switches is connected with a first wiring when said second and fourth switches are on,
   said second and third switches are off when said first and fourth switches are turned on in a first drive mode,
   said first and fourth switches are off when said second and third switch are turned on in a second drive mode, and
   said first drive mode and said second drive mode are periodically switched.

2. The amplifier circuit according to claim 1, wherein said first element is designed to have a same resistance value as that of said second element.

3. The amplifier circuit according to claim 1, wherein said first element is designed to have a same capacitance value as that of said second element.

4. The amplifier circuit according to claim 1, further comprising:
   a fifth switch disposed between said output node and a data line of a display panel, wherein said fifth switch is turned off during switching between said first drive mode and said second drive mode.

5. The amplifier circuit according to claim 1,
   wherein a reference voltage is supplied to said first wiring, and
   a gradation voltage, which is selected based on image data, is supplied to said second input node.

6. The amplifier circuit according to claim 1, wherein a gradation voltage selected based on image data is supplied to said first wiring, and a reference voltage is supplied to said second input node.

7. The amplifier circuit according to claim 5, further comprising:
a sixth switch connected to a first voltage source, and
a seventh switch connected to a second voltage source,
wherein said sixth and seventh switches selectively connects one of said first and second voltage sources to said first wiring, respectively.

8. The amplifier circuit according to claim 6, further comprising:
a sixth switch connected with a first voltage source; and
a seventh switch connected with a second voltage source,
wherein said sixth and seventh switches selectively connect said second input node with said first voltage source and said second voltage source, respectively.

9. A drive circuit comprising:
an amplifier circuit;
a data latch section, configured to latch a display data; and
a D/A converting section configured to supply a gradation voltage to said amplifier circuit based on the display data,
wherein said amplifier circuit drives a display panel based on the gradation voltage,
said amplifier circuit comprises:
an amplifier having first and second input nodes and one output node;
a feedback circuit including at least a first element and a second element and first, second, third, and fourth switches,
wherein:
one end of said first and second elements is connected directly with said first input node,
the other end of said first element is connected with one end of said first and second switches,
the other end of said second element is connected with one end of said third and fourth switches,
the other end of said first and third switches is connected with said output node when said first and third switches are on,
the other end of said second and fourth switches is connected with a first wiring when said second and fourth switches are on,
said second and third switches are off when said first and fourth switches are turned on in a first drive mode,
said first and fourth switches are off when said second and third switch are turned on in a second drive mode, and
said first drive mode and said second drive mode are periodically switched.

10. The drive circuit according to claim 9, wherein said first element is designed to have a same resistance value as that of said second element.

11. The drive circuit according to claim 9, wherein said first element is designed to have a same capacitance value as that of said second element.

12. The drive circuit according to claim 9, wherein said amplifier circuit further comprises:
a fifth switch disposed between said output node and a data line of a display panel, wherein said fifth switch is turned off during switching between said first drive mode and said second drive mode.

13. The drive circuit according to claim 9, wherein a reference voltage is supplied to said first wiring, and a gradation voltage which is selected based on image data is supplied to said second input node.

14. The drive circuit according to claim 9, wherein a gradation voltage selected based on image data is supplied to said first wiring, and a reference voltage is supplied to said second input node.

15. The drive circuit according to claim 13, wherein said amplifier circuit further comprises:
a sixth switch connected to a first voltage source; and
a seventh switch connected to a second voltage source,
wherein said sixth and seventh switches selectively connect one of said first and second voltage sources to said first wiring, respectively.

* * * * *